United States Patent [19]

Leopold et al.

[11] Patent Number: 5,148,170
[45] Date of Patent: Sep. 15, 1992

[54] HIGH RESOLUTION ANALOGUE-TO-DIGITAL CONVERTER

[75] Inventors: Hans Leopold; Paul O'Leary, both of Graz; Manfred Pacher, Lannach; Robert Roehrer; Gunter Winkler, both of Graz, all of Austria

[73] Assignee: Austria Mikro Systeme Internationale Gesellschaft m.b.H., Unterpremstatten, Austria

[21] Appl. No.: 813,054

[22] Filed: Dec. 23, 1991

Related U.S. Application Data

[63] Continuation of Ser. No. 562,552, Aug. 3, 1990, abandoned.

[30] Foreign Application Priority Data

Apr. 19, 1990 [EP] European Pat. Off. ........ 90890123.4

[51] Int. Cl.$^5$ .............................................. H03M 1/60
[52] U.S. Cl. .................................... 341/157; 307/271
[58] Field of Search ............... 341/157, 166, 167, 168, 341/163, 127, 128, 129; 307/271, 228, 359

[56] References Cited

U.S. PATENT DOCUMENTS

| | | | |
|---|---|---|---|
| 3,500,109 | 3/1970 | Sugiyama | 324/99 |
| 3,566,283 | 2/1971 | Diebler | 307/271 X |
| 3,918,050 | 11/1975 | Dorsman | 341/166 X |
| 3,942,172 | 3/1976 | Tucker | 341/127 |
| 4,083,044 | 4/1978 | Marshall, III et al. | 341/157 |
| 4,118,696 | 10/1978 | Warther | 341/157 |
| 4,588,984 | 5/1986 | Dorsman | 341/167 |
| 4,598,270 | 7/1986 | Shutt et al. | 341/166 |
| 4,623,800 | 11/1986 | Price | 307/362 X |
| 4,647,905 | 3/1987 | Hantke et al. | 341/166 |
| 4,695,742 | 9/1987 | Randall | 307/271 |
| 4,775,841 | 10/1988 | Trofimenkoff et al. | 307/271 X |
| 4,827,261 | 5/1989 | Trofimenkoff et al. | 341/157 |
| 4,847,620 | 7/1989 | Trofimenkoff et al. | 341/128 |

FOREIGN PATENT DOCUMENTS

| | | |
|---|---|---|
| 2044057 | 1/1975 | Fed. Rep. of Germany . |
| 2235540 | 1/1975 | France . |
| 2262807 | 9/1975 | France . |
| 1273790 | 5/1972 | United Kingdom . |
| 367522 | 9/1990 | United Kingdom . |

OTHER PUBLICATIONS

Redfern, Thomas P., Pulse Modulation A/D Converter, Microprocessor Controller Developments, Feb. 27–Mar. 34, 1978.

*Primary Examiner*—Howard L. Williams
*Attorney, Agent, or Firm*—Cushman, Darby & Cushman

[57] ABSTRACT

A monolithic integrated high resolution analog-to-digital converter based on a charge balancing process, characterized in that the output of a charge balancing integrator is connected to the control input of a pulse width modulator. An output of the pulse width modulator controls the temporal activity of the feedback signal in the charge balancing integrator. The output of the pulsewidth modulator is also connected to a digital calculation circuit which evaluates the pulse width result of the conversion. The input of the analog-to-digital converter is connected to one input of the charge balancing integrator and the feedback signal from the pulse width modulator is connected to the other input.

10 Claims, 2 Drawing Sheets

HIGH RESOLUTION ANALOGUE-TO-DIGITAL CONVERTER

This is a continuation of Application Ser. No. 07/562,552, filed on Aug. 3, 1990, which was abandoned.

BACKGROUND OF THE INVENTION

1. Field of the Invention

This invention relates to a monolithic integrated high resolution charge balancing analog-to-digital converter.

2. Background Information

One previously known analog-to-digital converter architecture is the classical charge balancing analog-to-digital converter. This concept has a nonlinear relationship between the number of transitions in the feedback signal and the signal level. This is a disadvantage because the transition timing errors, resulting from the generation of the binary feedback signal, result in a nonlinear characteristic for the analog-to-digital converter.

For high resolutions, the time discrete signal must be evaluated during a large number of clock cycles. Consequently, the expected number of signal transitions also increases. This results in a limited achievable accuracy with the classical charge balancing analogue-to-digital converter architecture.

SUMMARY OF THE INVENTION

An object of this invention is to reduce the above disadvantages thereby making it possible to produce monolithic integrated analog-to-digital converters with previously unobtainable resolutions for converters of this art.

A further object of this invention is to make it possible to integrate the analog-to-digital converter in a standard process, e.g. CMOS. Whereby, neither precision external elements nor element trimming is required to achieve high resolution. It should also be possible to reach high precision, e.g. 20 bit, with reference voltages of approximately 1 V whereby the use of higher reference voltages, e.g. 5 V, 10 V, will not result in a degredation of the converter's performance. The converter must have a high input impedance and low input currents to enable a direct connection to high impedance sensors. The analog-to-digital converter should not require a sample and hold circuit. It must be possible to reject electromagnetically coupled power supply noise.

These objects are accomplished according to this invention by connecting a output of the charge balancing integrator to the control input of a pulsewidth modulator. The output of the pulsewidth modulator is proportional to the amplitude at the pulsewidth modulator's control input. The output of the pulsewidth modulator controls the temporal activity of the feedback signal to the charge balancing integrator. The output of the pulsewidth modulator is also connected to a digital calculation circuit, the output of which is a digital representation of the analog signal at the input to the analog-to-digital converter. The charge balancing integrator is so arranged that the analog input signal is connected to the positive input and the pulse width modulated feedback signal is connected to the negative input.

This circuit has the advantage, that through the use of a pulse width modulated feedback signal in the charge balancing integrator, the number of transitions in the discrete amplitude signal during one conversion can be significantly reduced and exactly determined. Consequently the precision of the conversion process can be significantly improved.

One possible implementation involves the pulsewidth modulator converting its input into a corresponding discrete time pulsewidth modulated signal at its output. A discrete time pulsewidth modulator offers the advantage that a digital evaluation of the pulse duration is possible without any error. The resolution of the analog-to-digital converter is not limited by a limited number of possible pulse widths. The evaluation of the output over a number of pulsewidths makes it possible to reach higher resolutions.

A further feature of this invention is that the transitional edges of the pulsewidth modulator output signal are controlled by a clock signal and in this manner are bound to a fixed time base.

This makes it possible to synchronize the circuit with other portions of a complex system giving significant rejection to certain disturbances.

In an embodiment of the invention, the charge balancing integrator is implemented with an operational amplifier where the input to the analog-to-digital converter is connected directly or over an antialiasing filter to the noninverting input of the operational amplifier.

This embodiment gives a high impedance voltage input for the signal which is to be measured, making it possible to connect high impedance sensors directly to the analog-to-digital converter. Further, with this implementation it is possible to build the analog-to-digital converter with a single power supply because a charge balancing integrator built in this manner only requires a single polarity input and feedback signal. Besides this, it is possible to implement an antialiasing filter without a large effort, if necessary.

A further embodiment of this invention has a charge balancing integrator consisting of an operational amplifier, a capacitor and a resistor, where the resistor and capacitor can be discrete external components. Changing the RC constant makes it possible to adjust the charge balancing integrator to different clock frequencies or evaluation periods.

In a still further embodiment of the invention the operational amplifier in the charge balancing integrator makes an automatic zero point adjustment e.g. by means of chopper stabilization.

Through the feature of an operational amplifier with automatic zero point correction, the offset of the complete analog-to-digital converter is only dependent on the sum of the edge transition timing error during one conversion. Consequently the error can be kept very small.

In another embodiment of the invention, the operational amplifier in the charge balancing integrator has field effect input transistors. In this manner, errors which would occur in the charge balancing due to input bias currents can be avoided. Additionally it is possible to increase the impedance of the feedback resistor. This in turn reduces the analog-to-digital converter nonlinearity due to the source impedance of the feedback signal.

A further feature of the invention is that the analog-to-digital converter only requires a single power supply. This makes it possible to realize cheap high resolution data conversion systems.

A further embodiment of the invention has a digital counter and or a digital filter as digital calculation circuit. The application of a digital calculation circuit makes it possible to evaluate the output during a number of conversion periods. This results in a significant increase in resolution compared to conventional analog-to-digital converters.

BRIEF DESCRIPTION OF THE DRAWINGS

The following explains the invention with the aid of the drawings.

DETAILED DESCRIPTION OF THE PREFERRED EMBODIMENTS

Figure 1:
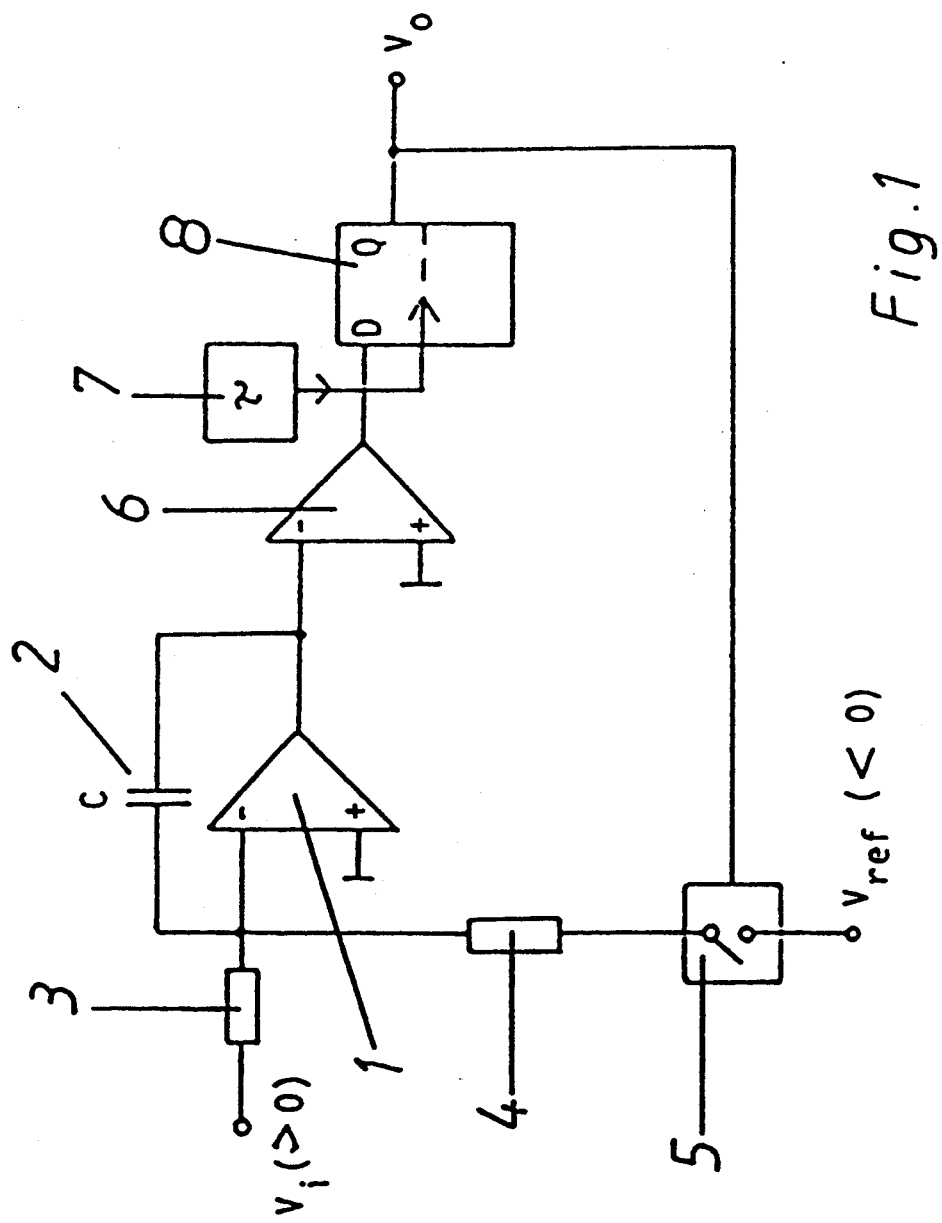
FIG. 1 shows a conventional charge balancing analog-to-digital converter.

The conventional charge balancing converter FIG. 1 has a charge balancing integrator, consisting of an operational amplifier 1, an integrator capacitor 2 and the scaling resistors 3 and 4. The input to the charge balancing integrator is on the one hand connected via the scaling resistor 3 to the input voltage $V_i$ and on the other hand via the scaling resistor 4 and the controlled switch 5 to the reference voltage Vref.

The output of the charge balancing converter is compared to a reference level by a comparator 6. The result of this comparison is a binary signal at the output of the comparator 6. The output of the comparator is stored in a D flip-flop 8 which is clocked by a clock generator 7. The output $V_0$ of the flip-flop is both the output of the converter and the control signal for the switch 5.

In the feedback branch of this circuit there is a time discrete binary signal, namely a current with values zero and Vref/R$_0$.

The time quantization is generated by the clock $\tau$ and the D flip flop FF, the output of which changes with the significant clock edge. The operational amplifier 1 together with the capacitor 2 and the comparator 6 form a control loop which functions to regulate the current feed to the chargebalancing integrator so that the time average current is zero. Should n pulses be counted, where the binary signal Vo is high (i.e. the switch 5 is closed), during m clock periods, the following is valid.

$$\frac{V_i}{R_1} + \frac{n}{m} \cdot \frac{V_{ref}}{R_0} = 0$$

$$n = -m \cdot \frac{V_i}{V_{ref}} \cdot \frac{R_0}{R_1}$$

R$_1$ is the resistor 3 R$_0$ is the resistor 4

The resolution of such an analog-to-digital converter is dependent on the value m. The number of signal transitions for conversion (i.e. the switching of 5) is large and has a nonlinear dependence on n. This is the limiting factor in the achievable accuracy with this type of charge balancing.

Every transition of the binary signal from one value to the other generates an error, e.g. due to switching timing errors in switch 5, which contributes to the total error. A "good" conversion algorithm should keep the number of signal transitions to a minimum. Further the number of transitions should be either constant or proportional to the input signal. Both these factors contribute to avoid the nonlinearity errors due to the switching timing errors.

A 20 bit precise analogue-to-digital, converter, for example, must generate a time discrete binary signal consisting of 1 million time increments during each conversion. There are a large number of combinations of the binary signal elements which result in a given average value over 1 million possible signal intervals. Since the output of the control loop is a one dimensional signal, all redundant degrees of freedom must be removed from the signal. This must take place in the circuit generating the time discrete signal.

Figure 2:
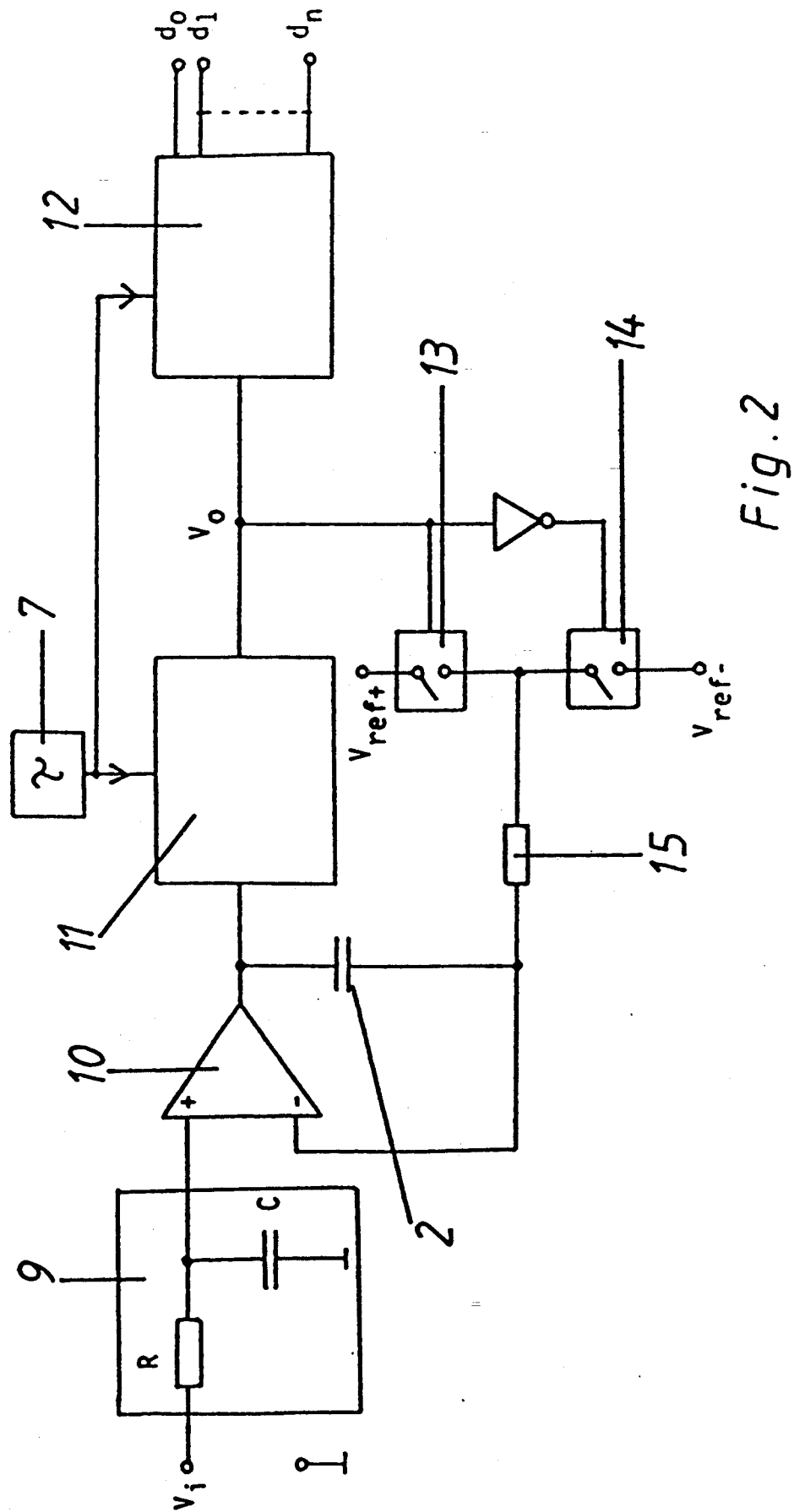
FIG. 2 shows one possible implementation of an analog-to-digital converter according to this invention.

FIG. 2 shows one possible implementation of an analog-to-digital converter according to this invention. The input signal $V_i$ is connected either directly to one input, i.e. the noninverting input of an operational amplifier 10 of a charge balancing integrator, or indirectly via an anti-aliasing filter 9. The charge balancing integrator comprises the operational amplifier 10 and an integrator capacitor 2 connected between the output of the operational amplifier 10 and the inverting input of the operational amplifier 10. Anti-aliasing filter 9 in its simplest form consists of a first order low pass filter. The output of the charge balancing integrator is connected to the control input of a pulse width modulator 11. The output of the pulse width modulator 11 is a pulse width modulated signal $V_0$, the pulse duration of this signal being dependent on the pulsewidth modulator control input signal. The pulsewidth modulator is preferably controlled by a clock signal from a clock generation circuit 7.

The pulsewidth modulator can, for example, consist of a clock controlled periodic ramp signal generator. The ramp amplitude is then compared with the output of the charge balancing integrator 10. With such a clock controlled ramp signal generator there are no stringent requirements on the ramps linearity because the resulting pulsewidth modulator nonlinearity is divided by the loop gain of the control loop. For simplicity of integration, a simple RC circuit is preferred as ramp generator.

In a practical embodiment of the invention, the pulsewidth modulator 11 generates an output pulse with a period of 1000 $\mu$s, the width duration of the period being quantized in 1 $\mu$s increments. The pulsewidth modulator 11 converts the value of the charge balancing integrator to a discrete signal. The output of the pulsewidth modulator is connected to a digital calculation circuit 12 and is used as the control for the complementary switched switches 13 and 14. The digital calculation circuit 12 can comprise a counter and/or a digital filter. These switches 13 and 14 connect the input inverting of the charge balancing integrator via a resistor 15 to the voltage sources $V_{ref+}$ and $V_{ref-}$ respectively. If the input $V_i$ to the analog-to-digital converter is connected to the noninverting input of the operational amplifier 10, then this gives a high impedance input and enables the functioning of the circuit with a single power supply.

The above described control loop corresponds to a first order delta sigma converter with a 10 bit quantizer in the forward branch of the loop, with a sampling frequency, for example, of one kilo Herz. The theoretical accuracy R of this converter is given by the following equation.

$$R = 1.5 \cdot \log_2 R_{OS} + N$$

This results in a theoretical accuracy of 25 bits with an oversampling ratio R$_{OS}$ of 1000 and a 10 bit quantizer analog-to-digital converter accuracy N of 10 bit in the forward branch of the loop).

The loop functions in the following manner: The voltage at the output of the operational amplifier 10 will settle at the value which results in a pulse width giving the best possible charge balancing in the integrator capacitor 2. Since the pulse width is quantized, there is only a limited set of input voltages which result in a perfect charge balancing. The residual charge from the individual pulse width periods is integrated until the composite residual charge forces the pulsewidth modulator to generate the next largest or next smaller pulse width. In this manner, the composite residual charge is reduced by an amount corresponding to one pulse width increment and so the pulsewidth modulator output signal returns to its original width. For a DC input, the pulsewidth modulator generates only two neighboring pulse widths, the frequency of occurance of the individual pulse width gives the information required for further resolution. When 1000 periods of a pulse width modulator with 1000 possible discrete pulse width have occurred, then one million discrete time events are available for evaluation corresponding to a 20 bit resolution: The evaluation of 1000 pulse width periods for the conversion can also be modeled as a 1000 times oversampling with a 10 bit quantization using noise shaping to move the quantization energy to higher frequencies.

The synchronization of the pulsewidth modulator control signal with the mains power supply frequency makes it possible to reject spurious frequency components in the input signal due to mains coupling.

For DC input signals $V_i$, the voltage over the integration capacitor 2 remains quasi static. Consequently there are no stringent requirements placed on the dielectric absorbtion properties of the integrator capacitor despite the very high resolution, e.g. 20 bit.

The offset error of the analog-to-digital converter shown in FIG. 2 results from the operational amplifier offset and the sum of the transition edge timing errors. The contribution from the operational amplifier 10 offset can be kept below 0.5 $\mu V$ with the use of input offset compensation. The use of a chopper stabilized operational amplifier is preferred in this application as they can be produced in integrated form and can achieve the desired performance without external trimming. If a switching time error of <1 ns is assumed for the switches 13 and 14, then the maximum composite error for 1000 pulses is <1 $\mu s$, corresponding to 1 L.S.B. by 20 bit in this analog-to-digital converter. Since the number of pulses is independent of the input voltage, the timing errors do not result in a gain error. The gain error is dominated by the common mode rejection ratio of the operational amplifier. The differential impedance of the switches 13 and 14 cause a nonlinearity in the analog-to-digital converter, the magnitude of which is dependent on the ratio of the impedance mismatch of 13 and 14 and the impedance of the resistor 15. To permit a large value for the resistor 15 and to minimize the loading of the sensor the operational amplifier should have a very low bias current requirement. This can be achieved with the use of field effect transistors in the input stage of the operational amplifier. The source impedance of $V_{ref+}$ and $V_{ref-}$ should also be considered when dimensioning the resistor 15. The differential source impedance must be added to the differential switch impedance of switches 13, 14. To guarantee an accuracy of 20 bits a total differential impedance of 4 ohm can be tolerated with a resistor 15 value of 1 mega ohm. of 1 mega ohm.

We claim:

1. An analog-to-digital converter, having an analog voltage input and a digital output, comprising:

a charge balancing differential integrator, comprising a differential amplifier and an integrator capacitor, said differential amplifier having a non-inverting input serving as said analog voltage input of the analog-to-digital converter, said integrator capacitor connected between an inverting input of the differential amplifier and a voltage output of said differential amplifier and an integrator resistor connected to the inverting input of said differential amplifier, the other end of said integrator resistor forming a negative input of the differential integrator, another capacitor connected between a noninverting input of the differential amplifier and ground and another resistor connected between the analog voltage input and the noninverting input of the differential amplifier;

pulse width modulator means, having a signal input, a clock input and an output, for outputting a pulse width modulated signal at each of its cycles of operation, said pulse width output at each said cycle having a period fixed by a system cycle clock signal input onto said clock input, said pulse width modulated signal having a quantized pulse width indicative of said voltage output of said differential amplifier received on said signal input and quantized to one of a defined plurality of values which gives the best possible charge balancing in said integrator capacitor, wherein said pulse width modulator means comprises a periodic ramp signal generator, a voltage of a periodic ramp signal output from the periodic ramp signal generator being compared with said voltage output of the differential amplifier a predetermined number of times during each said period of the pulse width modulated signal;

means for feeding back said pulse-width modulated signal to said inverting input of said differential amplifier;

said charge balancing differential integrator producing a residual charge indicative of a difference between said quantized pulse width and perfect charge balance over plural cycles of said pulse width modulator means, until said residual charge accumulates sufficiently over said plural cycles to cause said pulse width modulator means to generate another quantized pulse width based on adjustment by said residual charge; and a digital encoding means for monitoring a plurality of outputs of said pulse width modulator means over a plurality of said cycles for producing and outputting a digital value onto said digital output of the analog-to-digital converter which is indicative of both a) said pulse width of said pulse width modulated signal and b) the frequency of occurrence of said quantized pulse width and said another quantized pulse width, over said plurality of cycles.

2. The analog-to-digital converter of claim 1, wherein said periodic ramp signal generator comprises a current limiting means, a capacitor charged by said current limiting means, and a switch for periodically discharging said capacitor, a voltage across said capacitor thereby forming a ramp.

3. The analog-to-digital converter of claim 1, wherein said differential amplifier is a chopper stabilized operational amplifier.

4. The analog-to-digital converter of claim 1, wherein said differential amplifier is an operational amplifier, said inverting and noninverting inputs comprising field effect transistors.

5. The analog-to-digital converter of claim 1, wherein said digital encoding means receives said system cycle clock signal.

6. The analog-to-digital converter of claim 1, wherein said digital encoding means comprises a digital counter.

7. The analog-to-digital converter of any one of claims 1 or 2-6, wherein said analog-to-digital converter is monolithically integrated and has only one power supply voltage.

8. An analog-to-digital converter as in claim 1 wherein said pulse width modulator means corresponds to a 10-bit quantizer such that said integrator capacitor stores a charge which has a maximum value of a least significant bit of said 10-bit quantizer.

9. An analog-to-digital converter, having an analog voltage input and a digital output, comprising:
- a difference integrator, comprising a differential amplifier, an integrator capacitor connected between an inverting input of the differential amplifier and an output of said differential amplifier and an integrator resistor connected to the inverting input of said differential amplifier, an other end of said integrator resistor forming a negative input of the difference integrator, another capacitor between a noninverting input of the differential amplifier and ground and another resistor connected between the analog voltage input and the noninverting input of the differential amplifier;
- pulse width modulator means, having a signal input, a clock input and an output, for outputting a pulse width modulated two-valued signal having a fixed period and a variable pulse width both being an integer multiple of a clock signal input onto said clock input, said pulse width modulated signal having a quantized pulse width that is responsive to said voltage output of said differential amplifier received on said signal input, wherein said pulse width modulator means comprises a periodic ramp signal generator, a voltage of a periodic ramp signal output from the periodic ramp signal generator being compared with said voltage output of the differential amplifier a predetermined number of times during each said period of the pulse width modulated signal;
- a switching means, for feeding back one reference voltage when the output of said pulse width modulator is in one state and another reference voltage when the output of said pulse width modulator is in the other state to the negative input of said difference integrator; and
- a digital encoding means for monitoring a duty-ratio of the pulse width modulated signal and outputting a digital output indicative thereof.

10. A converter as in claim 9, wherein said digital encoding means includes at least one of a counter and-/or a digital filter circuit.

* * * * *